(12) United States Patent
Hong

(10) Patent No.: US 7,112,511 B2
(45) Date of Patent: Sep. 26, 2006

(54) CMOS IMAGE SENSOR HAVING PRISM AND METHOD FOR FABRICATING THE SAME

(75) Inventor: Hee Jeong Hong, Chungcheongbuk-do (KR)

(73) Assignee: MagnaChip Semiconductor, Ltd., (KR)

( * ) Notice: Subject to any disclaimer, the term of this patent is extended or adjusted under 35 U.S.C. 154(b) by 41 days.

(21) Appl. No.: 11/073,192

(22) Filed: Mar. 4, 2005

(65) Prior Publication Data

US 2005/0250241 A1 Nov. 10, 2005

(30) Foreign Application Priority Data

May 6, 2004 (KR) .................. 10-2004-0032009

(51) Int. Cl.
*H01L 21/76* (2006.01)
*H01L 21/336* (2006.01)

(52) U.S. Cl. .................. 438/427; 438/426; 438/424; 438/437; 438/296; 438/435; 257/315; 257/319; 257/354; 257/69; 257/E21.366

(58) Field of Classification Search ........ 438/427, 438/424, 426, 437, 296, 435; 257/354, 315, 257/319
See application file for complete search history.

(56) References Cited

U.S. PATENT DOCUMENTS 6,372,603 B1 * 4/2002 Yaung et al. .......... 438/424
2005/0158897 A1 * 7/2005 Sze et al. .............. 438/29

* cited by examiner

*Primary Examiner*—Michael Lebentritt
*Assistant Examiner*—Mohsen Ahmadi
(74) *Attorney, Agent, or Firm*—Blakely Sokoloff Taylor & Zafman

(57) ABSTRACT

A method for fabricating a CMOS image sensor with a prism includes the steps of: forming a plurality of photodiodes corresponding to respective unit pixels on a substrate; sequentially forming an inter-layer insulation layer and an uppermost metal line on the substrate and the photodiodes; etching the inter-layer insulation layer to form a plurality of trenches corresponding to the respective photodiodes; depositing a high density plasma (HDP) oxide layer such that the HDP oxide layer disposed between the trenches has a tapered profile; depositing a nitride layer having a higher refractive index than that of the inter-layer insulation layer to fill the trenches; and depositing an insulation layer having a lower refractive index than that of the nitride layer to fill the trenches, thereby forming a prism, wherein the prism induces a total reflection of lights incident to the photodiodes disposed in edge regions of a pixel array.

22 Claims, 8 Drawing Sheets

CMOS IMAGE SENSOR HAVING PRISM AND METHOD FOR FABRICATING THE SAME

FIELD OF THE INVENTION

The present invention relates to a complementary metal oxide semiconductor (CMOS) image sensor; and more particularly, to a CMOS image sensor with a prism instead of a microlens and a method for fabricating the same.

DESCRIPTION OF RELATED ARTS

Generally, an image sensor is a semiconductor device that converts an optical image into an electric signal. Among various types of the image sensor, charge coupled devices (CCDs) and complementary metal-oxide semiconductor (CMOS) image sensors are representative types of the image sensor.

In the charge coupled device, metal-oxide semiconductor (MOS) capacitors are closely allocated with each other, and charge carriers are transported and stored into the MOS capacitors. Meanwhile, the CMOS image sensor is a device that adopts a switching mode, wherein outputs are sequentially detected by MOS transistors made with the same number of pixels through employing CMOS technology using a control circuit and a signal processing circuit as a peripheral circuit.

However, the CCD has several problems; that are, complex driving modes, lots of power dissipation and complicated manufacturing processes requiring masking processes. Also, the charge coupled device has a difficulty in realizing one-chip system since a signal processing circuit cannot be implemented within a chip of the CCD. Therefore, to overcome these disadvantages, there have been active attempts to develop CMOS image sensors with employing sub-micron CMOS fabrication technology.

Especially, the CMOS image sensor reproduces images by detecting signals sequentially through using a switching mode along with MOS transistors and a photodiode formed within a unit pixel. The CMOS technology provides effects on reduction in power consumption and a simplified manufacturing process. Under the CMOS technology, the CMOS manufacturing process requires only about 20 masks in comparison with the CCD manufacturing process requiring about 30 to about 40 masks. Also, the CMOS technology makes it possible to implement various signal processing circuits into one chip. As a result of these effects, the CMOS image sensor has been highlighted as the next generation image sensor.

FIG. 1A is a circuit diagram showing a unit pixel including one photodiode and four MOS transistors in a conventional CMOS image sensor.

As shown, a photodiode 100 generates photo-electric charges after receiving light. The four MOS transistors are a transfer transistor 101, a reset transistor 103, a drive transistor 104 and a select transistor 105. In detail, the transfer transistor 101 is for transferring the photo-electric charges collected at the photodiode 100 to a floating diffusion region 102. The reset transistor 103 serves a role in setting an electric potential of the floating diffusion region 102 in an intended level and discharges the photo-electric charges to reset the floating diffusion region 102. Also, the drive transistor 104 serves as a source follower buffer amplifier. The select transistor 105 provides a switching function to carry out an addressing procedure. In addition to these four transistors, there is an additional load transistor 106 for reading an output signal.

Especially for an image sensor for realizing color images, a color filter array (CFA) is disposed on top of a photo-detection part that generates photo-electric charges after receiving lights form an external source and stores the generated photo-electric charges. The CFA includes three color filters for red, green and blue or other three color filters for yellow, magenta and cyan.

Also, the image sensor includes a photo-detection part for detecting incident lights and a logic circuit part for processing the detected lights into electric signals which are, in turn, converted into data. To improve photosensitivity, it has been attempted to increase a nominal fill factor which is a ratio of an area of the photo-detection part with respect to a total area of the unit pixel. One commonly employed method for increasing the nominal fill factor is to employ microlenses.

That is, to increase the photosensitivity, there has been developed a light collection method for changing paths of lights hitting regions except for the photo-detection part and collecting the lights into the photo-detection part. For this light collection method, microlenses are formed on color filters of the image sensor.

Typically, the microlenses are formed by using a photo-resist material. In particular, FIG. 1B is a cross-sectional view showing a conventional CMOS image sensor including color filters and microlenses. With reference to FIG. 1B, a structure of the conventional CMOS image sensor will be described in detail.

First, a device isolation layer 11 defining an active region and a field region is formed on a substrate 10. For each unit pixel, there is a photo-detection unit 12 including photo-diodes and so on. In FIG. 1B, transistors included in the unit pixel are not illustrated.

Afterwards, an inter-layer insulation layer 13 is formed on the above obtained substrate structure, and a plurality of first metal lines 14 are formed on the inter-layer insulation layer 13. Afterwards, another inter-layer insulation layer 15 is formed on the plurality of first metal lines 14. Then, a plurality of second metal lines 16 are formed on said another inter-layer insulation layer 15.

At this time, although FIG. 1B illustrates two layers of the metal lines, it is possible to form more than two layers of metal lines. Furthermore, the first metal lines 14 and the second metal lines 16 are disposed intentionally not to block the incident lights from entering into the photo-detection units 12. Also, said another inter-layer insulation layer 15 serves as an inter-metal insulation layer to electrically insulate the first metal lines 14 and the second metal lines 16 from each other.

After the formation of the second metal lines 16, a passivation layer 17 is formed on the second metal lines 16 to protect devices from moisture and scratches. Then, a plurality of color filters 18 for realizing color images are formed on the passivation layer 17. At this time, the color filters 18 are generally formed by using a dyed photoresist and, for each unit pixel, one color filter 18 is formed to separate colors from lights incident to the corresponding photo-detection unit 12.

Since adjacently allocated color filters 18 are superimposed with each other, it is typical that the completely formed color filters 18 have different heights. At this time, the microlenses 20 which will be formed subsequently can be function properly when being formed on a planarized surface. Therefore, it is mandated to eliminate the difference between heights of the color filters 18. To achieve this effect, a planarization layer 19 is formed on the color filters 18, and then, the microlenses 20 are formed on the planarization layer 19.

A typical method for forming the microlenses 20 will be described hereinafter. First, a photoresist layer with a good light transmittance is formed on the planarization layer 19 and patterned in a rectangular shape.

Next, a thermal process is applied to flow the photoresist layer, and through the thermal process, it is possible to obtain microlenses in a dome shape. After the formation of the microlenses 20, a low temperature oxide (LTO) layer 21 is formed to protect the microlenses 20. Then, general chip fabrication processes such as a pad opening process, a packaging process and so on are carried out.

Chips fabricated through the above described steps are used to construct modules for cameras, cellular phones, CCTV and the like. Generally, exterior lenses are used when such modules are configured.

FIG. 1C is a diagram showing paths of lights incident to a conventional CMOS image sensor with using an exterior lens. In more detail, FIG. 1C shows a path of an incident light to a central portion of a pixel array and another path of incident lights to edge portions of the pixel array.

As shown, the incident light to the central portion of the pixel array through the exterior lens enters to a central portion of a photodiode PD through a microlens without losing any light. In this case, as a result, efficiency on light collection is very high. However, the incident lights to the edge portions of the pixel array through the exterior lens are more frequently collected at sites apart from the central portion of the photodiode PD even if the incident lights pass through other microlenses.

That is, depending on a distance between a central point of the exterior lens and the individual unit pixels, angles of the incident lights to the unit pixels are different from each other. Thus, it is impossible to focus the incident lights to the center of the photodiode PD. For this reason, the photosensitivity is different at the center of the pixel array and at the edge portions of the pixel array.

In addition to this disadvantage, when the microlenses are used, an upper profile of a constructed structure for the image sensor is rough because of the microlenses and thus, contaminants are easily stuck to the microlenses. Also, it is difficult to clean the contaminants.

Moreover, when the microlenses are fabricated by using a photoresist, because of properties of the microlenses, conventionally used photoresist materials cannot be used. Instead, it is required to use expensive photoresist materials. Also, such additional processes as a microlens patterning process, a baking process, a flow process, a LTO deposition process and so on are necessarily applied, thereby increasing manufacturing costs.

SUMMARY OF THE INVENTION

It is, therefore, an object of the present invention to provide a complementary metal oxide semiconductor (CMOS) image sensor using a prism for collecting lights instead of a microlens made of a photoresist material and a method for fabricating the same.

In accordance with an aspect of the present invention, there is provided a method for fabricating a complementary metal oxide semiconductor (CMOS) image sensor with a pixel array including a plurality of unit pixels, the method including the steps of: forming a plurality of photodiodes corresponding to the respective unit pixels on a substrate; sequentially forming an inter-layer insulation layer and an uppermost metal line on the substrate and the photodiodes; etching the inter-layer insulation layer in a predetermined depth to form a plurality of trenches corresponding to the respective photodiodes; depositing a high density plasma (HDP) oxide layer such that the HDP oxide layer disposed between the trenches has a tapered profile; depositing a nitride layer having a higher refractive index than that of the inter-layer insulation layer to fill the trenches with a predetermined thickness; and depositing an insulation layer having a lower refractive index than that of the nitride layer to fill the trenches, thereby forming a prism, wherein the prism induces a total reflection of lights incident to the photodiodes disposed in edge regions of the pixel array.

In accordance with another aspect of the present invention, there is provided a method for fabricating a complementary metal oxide semiconductor (CMOS) image sensor with a pixel array including a plurality of unit pixels, the method including the steps of: forming a plurality of photodiodes corresponding to the respective unit pixels; sequentially forming an inter-layer insulation layer and an uppermost metal line on the substrate and the plurality of photodiodes; etching the inter-layer insulation layer in a predetermined depth to form a plurality of trenches corresponding to the respective photodiodes; depositing a high density oxide (HDP) oxide layer such that a portion of the HDP oxide layer disposed between the trenches has a tapered profile; filling a nitride layer having a higher refractive index than that of the inter-layer insulation layer into the trenches, thereby forming a prism; forming a planarization layer on the insulation layer; and forming a plurality of color filter arrays on the planarization layer, wherein the prism includes a total reflection of lights incident to the photodiodes disposed in edge regions of the pixel array.

In accordance with still another aspect of the present invention, there is provided a complementary metal oxide semiconductor (CMOS) image sensor with a pixel array including a plurality of unit pixels, the CMOS image sensor including: a plurality of photodiodes being formed on a substrate and corresponding to the respective unit pixels; an inter-layer insulation layer formed on the substrate and the photodiodes; an uppermost metal line formed on the inter-layer insulation layer; a plurality of trenches being formed by etching the inter-layer insulation layer in a predetermined depth and corresponding to the respective photodiodes; a high density plasma (HDP) oxide layer of which portion disposed between the trenches has a tapered profile; a nitride layer filled into the trenches with a predetermined thickness and having a higher refractive index than that of the inter-layer insulation layer; a prism inducing a total reflection of lights incident to the photodiodes disposed in edge regions of the pixel array and having a stack structure obtained by depositing an insulation layer on the nitride layer, the insulation layer having a lower refractive index than that of the nitride layer; a planarization layer formed on the insulation layer; and a plurality of color filter arrays formed on the planarization layer.

In accordance with further aspect of the present invention, there is provided a complementary metal oxide semiconductor (CMOS) image sensor with a pixel array including a plurality of unit pixels, the CMOS image sensor including: a plurality of photodiodes being formed on a substrate and corresponding to the respective unit pixels; an inter-layer insulation layer formed on the substrate and the photodiodes; an uppermost metal line formed on the inter-layer insulation layer; a plurality of trenches being formed by etching the inter-layer insulation layer in a predetermined depth and corresponding to the respective photodiodes; a high density plasma (HDP) oxide layer of which portion disposed between the trenches has a tapered profile; a prism being formed by filling the trenches with a nitride layer having a higher refractive index than that of the inter-layer insulation layer and inducing a total reflection of lights incident to the photodiodes disposed in edge regions of the pixel array; a planarization layer formed on the insulation layer; and a plurality of color filter arrays formed on the planarization layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A CMOS image sensor having a prism and a method for fabricating the same in accordance with a preferred embodiment of the present invention will be described in detail with reference to the accompanying drawings.

FIGS. 2A to 2G are cross-sectional views illustrating a method for fabricating a CMOS image sensor in accordance with the preferred embodiment of the present invention.

Figure 1A:
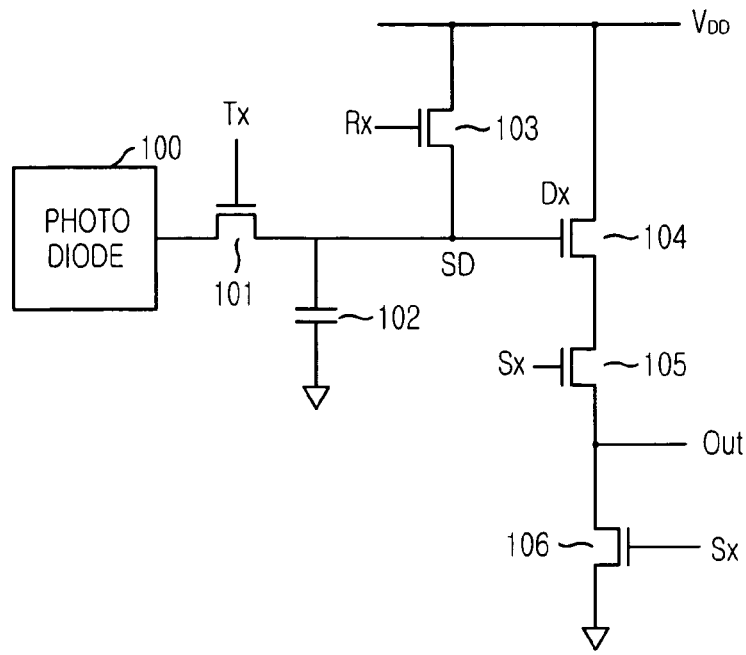
FIG. 1A is a circuit diagram showing a unit pixel of a conventional image sensor including one photodiode and four transistors.
Figure 1B:
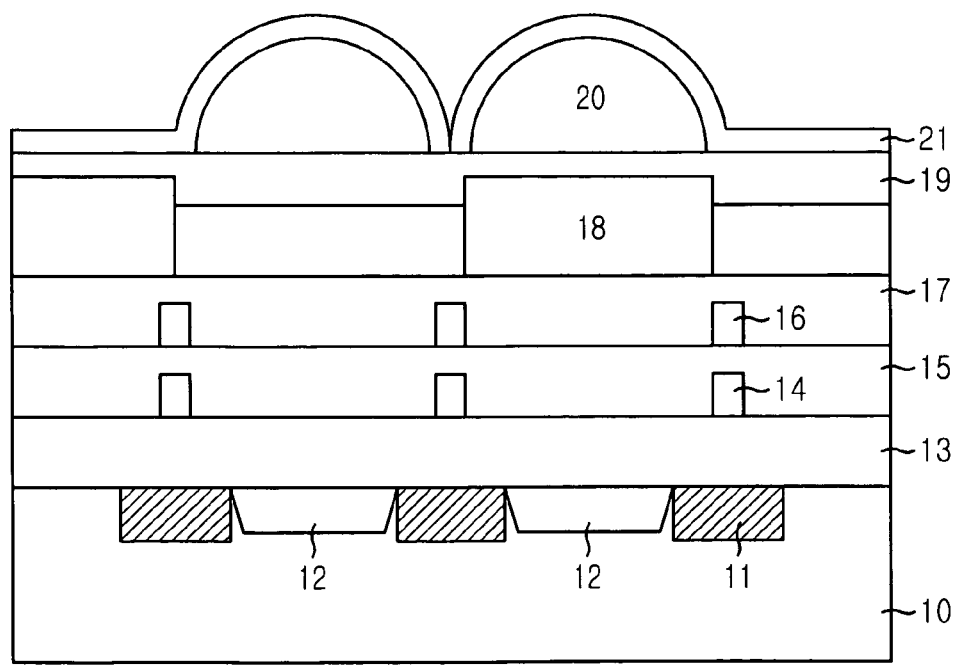
FIG. 1B is a cross-sectional view showing a conventional image sensor with microlenses.
Figure 1C:
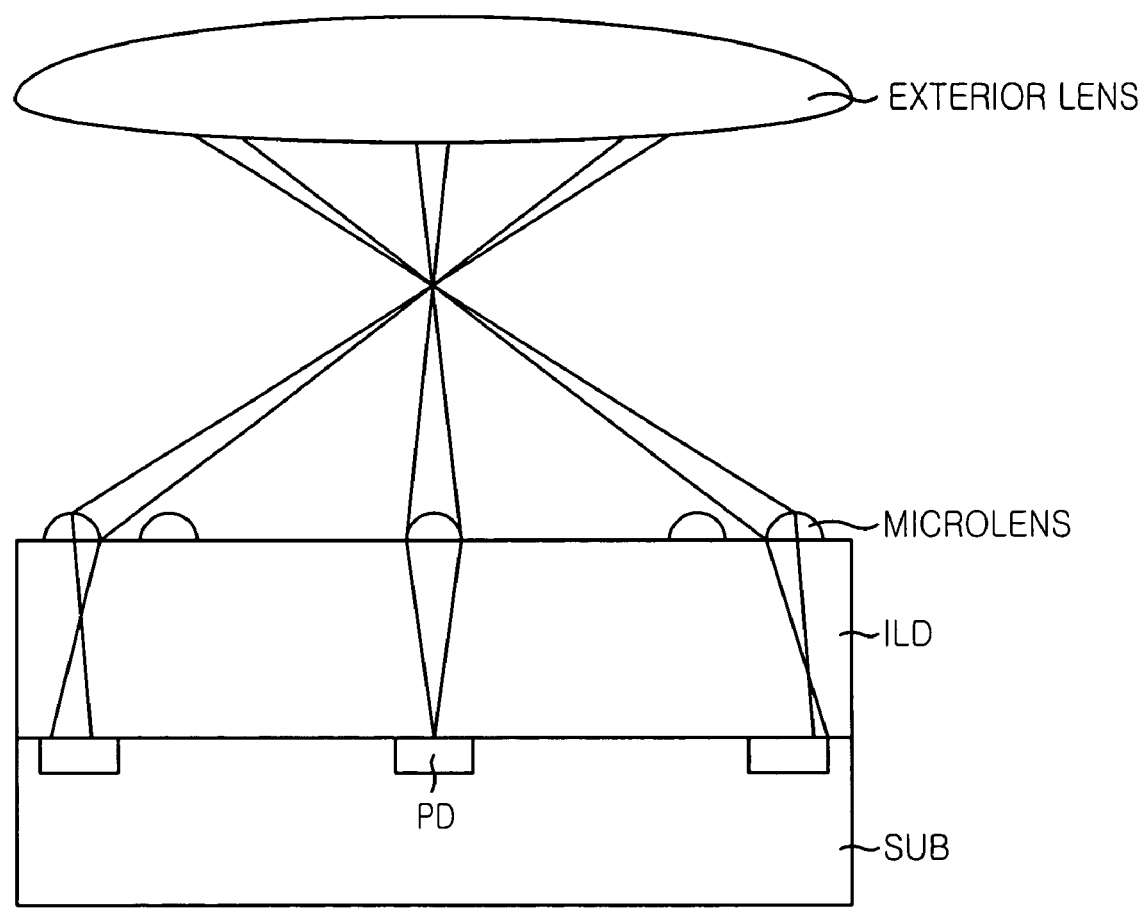
FIG. 1C is a diagram illustrating a problem in that photosensitivity is different at a central portion of a pixel array and edge portions of the pixel array in a conventional image sensor with microlenses.
Figure 2A:
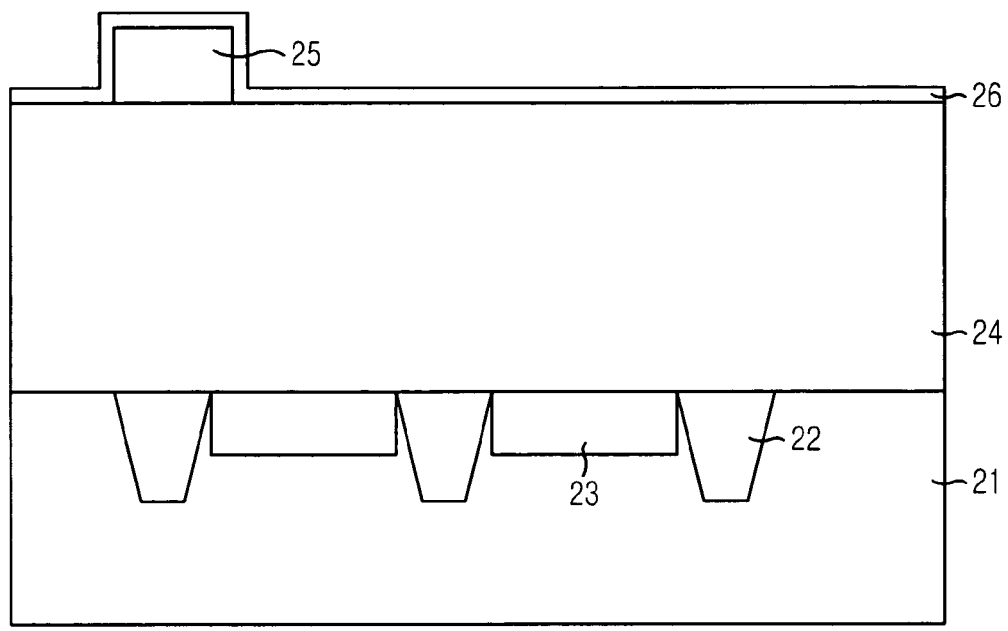
FIGS. 2A to 2G are cross-sectional views illustrating a method for fabricating a complementary metal oxide semiconductor (CMOS) image sensor in accordance with a preferred embodiment of the present invention.

Referring to FIG. 2A, a device isolation layer 22 defining an active region and a field region is formed on a substrate 21 by employing one of a local oxidation of silicon (LOCOS) method and a shallow trench isolation (STI) method.

At this time, the substrate 21 is a P-type semiconductor. Also, a stack structure obtained by forming a lowly doped P-type epitaxial layer on a highly doped P-type substrate can be used as the substrate 21. The use of the stack structure provides an effect on an increase in capacity of a photodiode by being capable of expanding a depletion region of the photodiode. Also, the highly doped P-type substrate prevents photo-electrons generated at a unit pixel from moving towards other adjacent unit pixels and as a result, it is further possible to prevent a cross-talk problem.

Next, although not illustrated, a process for patterning gate electrodes of transistors included in the unit pixel is performed. Afterwards, a plurality of photodiodes 23 are formed on predetermined portions of the active region.

Typically, a photodiode is constructed by forming an N-type ion implantation region in a deep region of a substrate and a P-type ion implantation region on top of the N-type ion implantation region. Herein, the N-type ion implantation region and the P-type ion implantation region are called a deep N and a p0 region, respectively. In addition to the P-type substrate 21, a photodiode structure of P/N/P is frequently used. It should be noted that the simplified structure of the photodiode 23 is illustrated in FIG. 2A.

Subsequently, an oxide-based inter-layer insulation layer, a multi-layer of metal lines and an inter-metal insulation layer for insulating the upper and lower metal lines from each other are formed on the photodiodes 23 and the gate electrodes (not shown).

At this time, for the metal lines, three layers of metal lines are commonly used, and the metal lines are disposed such that paths of incident lights to the photodiodes 23 are not blocked. In FIG. 2A, the multi-layer of metal lines and the inter-metal insulation layer are illustrated as one inter-layer insulation layer 24.

Hereinafter, a metal line formed on an uppermost region of the inter-layer insulation layer 24 is called an uppermost metal line 25. In general, a process for forming a passivation layer is performed after the formation of the uppermost metal line 25. Unlike this general passivation process, a different process is applied in this preferred embodiment of the present invention. That is, a first tetraethylorthosilicate (TEOS) oxide layer 26 is formed covering the uppermost metal line 25. At this time, the first TEOS oxide layer 26 has a thickness of several thousands in angstroms (Å).

Figure 2B:
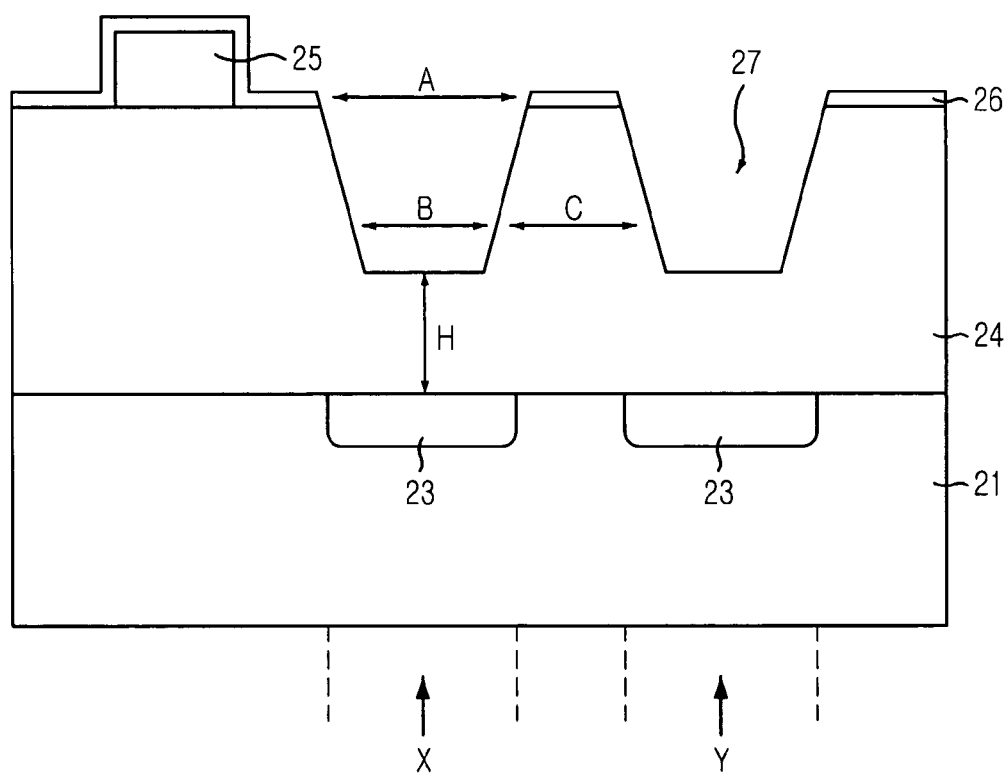

Referring to FIG. 2B, a plurality of trenches 27 are formed in regions corresponding to the photodiodes 23 by etching the first TEOS oxide layer 26 and the inter-layer insulation layer 24 with a predetermined depth. At this time, the trenches 27 correspond to the photodiodes 23 individually and have an inverted trapezoidal shape.

FIG. 2B illustrates two trenches 27; one in the right side is a trench corresponding to the photodiode 23 disposed in a central region of a pixel array and the other in the left side is a trench corresponding to an edge region of the pixel array. Herein, the reference denotations X and Y represent the edge region of the pixel array and the central region of the pixel array, respectively.

Also, it should be noted that the trenches 27 are regions where prisms are formed and the size of the individual trench 27 is set based on the sizes of the photodiode and the unit pixel. For instance, if a pitch of the unit pixel is approximately 3 μm, a diameter A of an upper portion of the trench 27 preferably ranges from approximately 2.0 μm to approximately 2.8 μm, and a distance C between the trenches 27 ranges from approximately 0.2 μm to approximately 1.0 μm. If a diameter of the photodiode 23 existing within the unit pixel is approximately 2.0 μm, a diameter of a bottom portion of the trench 27 preferably ranges from approximately 1.0 μm to approximately 1.6 μm. Moreover, another distance H from a bottom surface of the trench 27 to the photodiode 23 is in a range from approximately 1,000 Å to approximately 10,000 Å.

Figure 2C:
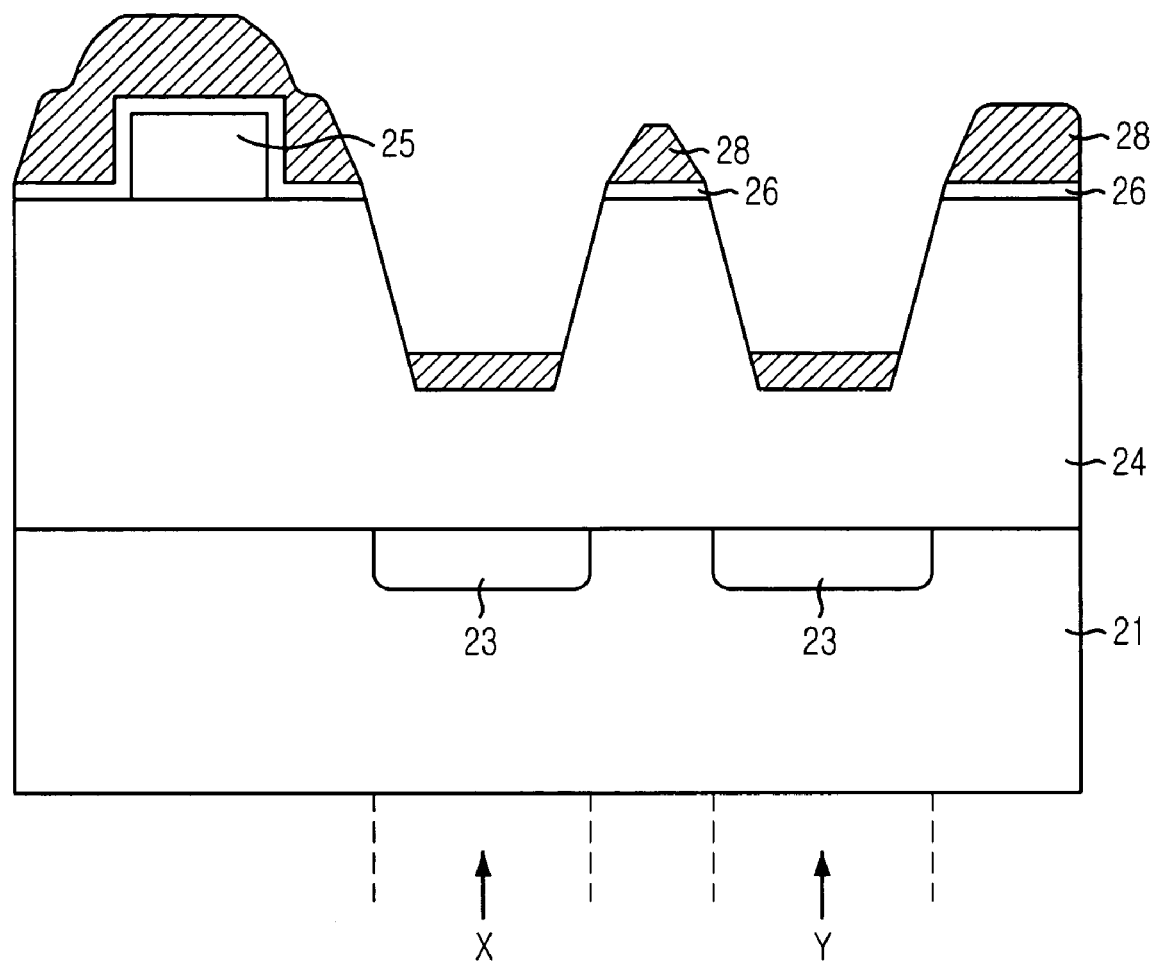

Referring to FIG. 2C, a high density plasma (HDP) oxide layer 28 is deposited on the first TEOS oxide layer 26 and the trenches 27. At this time, the HDP oxide layer 28 has a thickness ranging from approximately 2,000 Å to approximately 5,000 Å. Because of deposition characteristics of the HDP oxide layer 28, the HDP oxide layer 28 is deposited in a tapered profile on a portion of the first TEOS oxide layer 26 disposed between the trenches 27. In contrast, the HDP oxide layer 28 is deposited flat at bottom surfaces of the trenches 27.

The reason for using the HDP oxide is to reduce a loss of lights by making the HDP oxide have a tapered profile at the space between the trenches 27. That is, if the space between the trenches 27 is wide by having a plane profile, those lights incident to this space is wasted by not being used for realizing images.

However, according to the preferred embodiment of the present invention, the tapered profile of the HDP oxide layer 28 at the space between the trenches 27 provides an effect of minimizing the loss of lights.

Figure 2D:
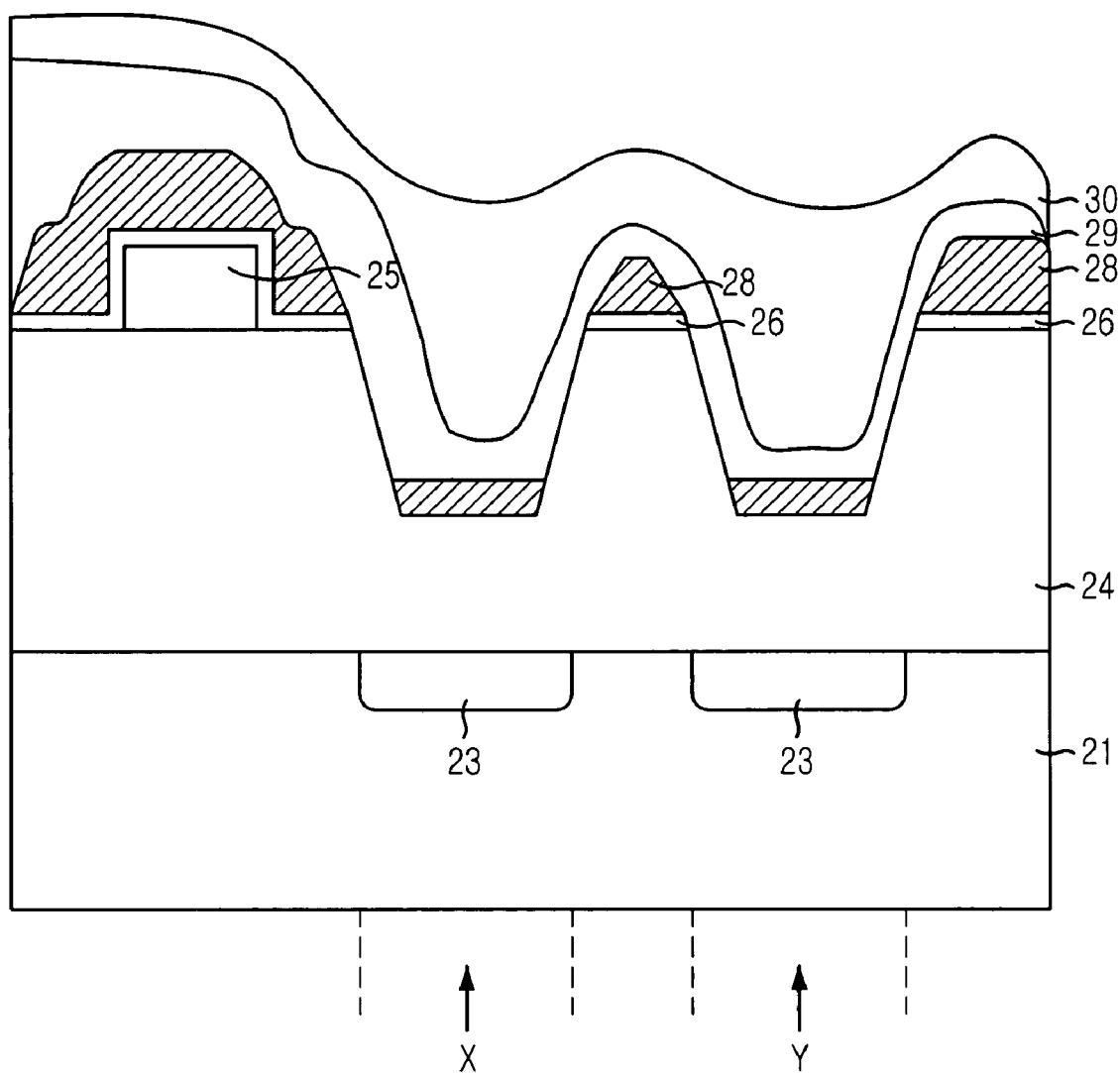

Referring to FIG. 2D, a material with a high refractive index is filled into the trenches 27 in order to form a prism. Herein, for the high refractive material, a nitride layer 29 is used. That is, since the trenches 27 are formed by etching the oxide-based inter-layer insulation layer 24, it is necessary to use a trench-filling material that has a higher index of refraction than that of the inter-layer insulation layer 24 in order to form a prism structure inducing a total reflection.

In this preferred embodiment, silicon nitride (SiN) is used as one exemplary trench-filling material. Herein, silicon nitride has a refractive index of approximately 2.0 and an absorption coefficient of approximately 0. Also, silicon oxide ($SiO_2$) used for the inter-layer insulation layer 24 has a refractive index of approximately 1.46.

With reference to these values, the nitride layer 29 is filled into the trenches 27 until a thickness of the nitride layer 29 ranges from approximately 0.2 μm to approximately 1.5 μm. Since an upper diameter of the trench 27 is in a range from approximately 2.0 μm to approximately 2.8 μm, if the thickness of the nitride layer 29 is more than approximately 1.5 μm, the trenches 27 are completely filled with the nitride layer 29.

Although it is possible to completely fill the trenches 27 with the nitride layer 29, another method of filling the trenches is suggested in consideration of light transmittance of the nitride layer 29. That is, since nitrides have a lower light transmittance than oxides, another material is preferably filled into the trenches 27 in addition to the nitride layer 29.

Therefore, the thickness of the nitride layer 29 in this preferred embodiment of the present invention is set to be in a range from approximately 0.2 μm to approximately 1.5 μm. After the deposition of the nitride layer 29, an insulation layer 30 is filled into portions of the trenches 27 not being filled with the nitride layer 29. At this time, the insulation layer 30 is a layer selected from a group consisting of a field oxide (FOX) layer, a hydrogen silsesquioxane (HSQ) layer and a spin-on-glass (SOG) layer.

Herein, the Fox layer is an oxide layer used for a device isolation process and has a refractive index of approximately 1.41 which is similar to that of oxide. Also, the HSQ layer and the SOG layer have the similar refractive index to that of oxide. Particularly, after the formation of the insulation layer 30, the insulation layer 30 is flowed at a temperature ranging from approximately 350° C. to approximately 450° C. to fill the trenches 27.

As a result, those lights incident to the trenches 27 transmit through the insulation layer 30 of which refractive index is similar to that of oxide and then hit the nitride layer 29. Afterwards, the lights transmitted through the nitride layer 29 hit the inter-layer insulation layer 24. At an interface between the nitride layer 29 and the inter-layer insulation layer 24, there occurs a total reflection caused by different indices of refraction and incident angles.

Those light that are totally reflected cannot get out of the prism and thus, being collected at the photodiodes 23. Hence, the prism can be substituted for the microlenses used as a light collector in a conventional image sensor. That is, in case of the unit pixel allocated in the central region Y of the pixel array, incident lights transmitted through the exterior lens are collected at the central portion of the photodiode 23 with high efficiency.

When the conventional microlenses are used, those incident lights to the unit pixel allocated at the edge region X of the pixel array are not frequently collected at the photodiode. Therefore, the preferred embodiment of the present invention employs the prism instead of the microlenses. As a result of this use of the prism, incident lights with a large incident angle among those incident lights to the unit pixel allocated at the edge region X of the pixel array can be collected at the photodiodes 23. Accordingly, it is possible to reduce a difference in photosensitivity between the central region Y of the pixel array and the edge region X of the pixel array.

Figure 2E:
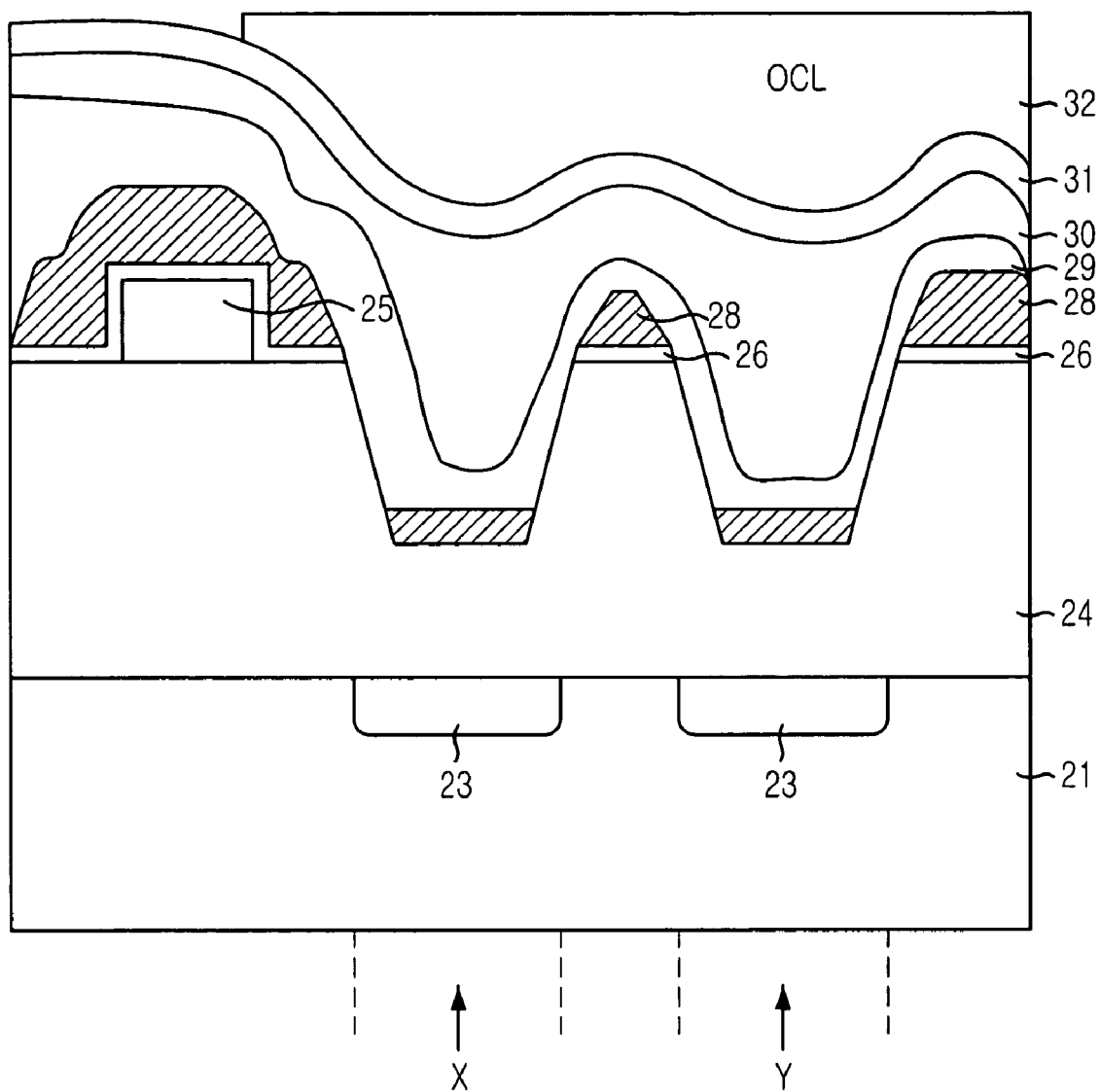

Referring to FIG. 2E, after the flow process with respect to the insulation layer 30, a second TEOS oxide layer 31 is formed on the insulation layer 30. At this time, the second TEOS oxide layer 31 has a thickness of approximately 1,000 Å. Also, the second TEOS oxide layer 31 serves a role in preventing degradation of properties of the insulation layer 30 that is easily contaminated. The second TEOS oxide layer 31 helps subsequent processes to be stably carried out. Afterwards, an over-coating layer (OCL) 32 which serves as a planarization layer is formed on the second TEOS oxide layer 31. Hereinafter, the OCL 32 is referred to as the planarization layer.

Figure 2F:
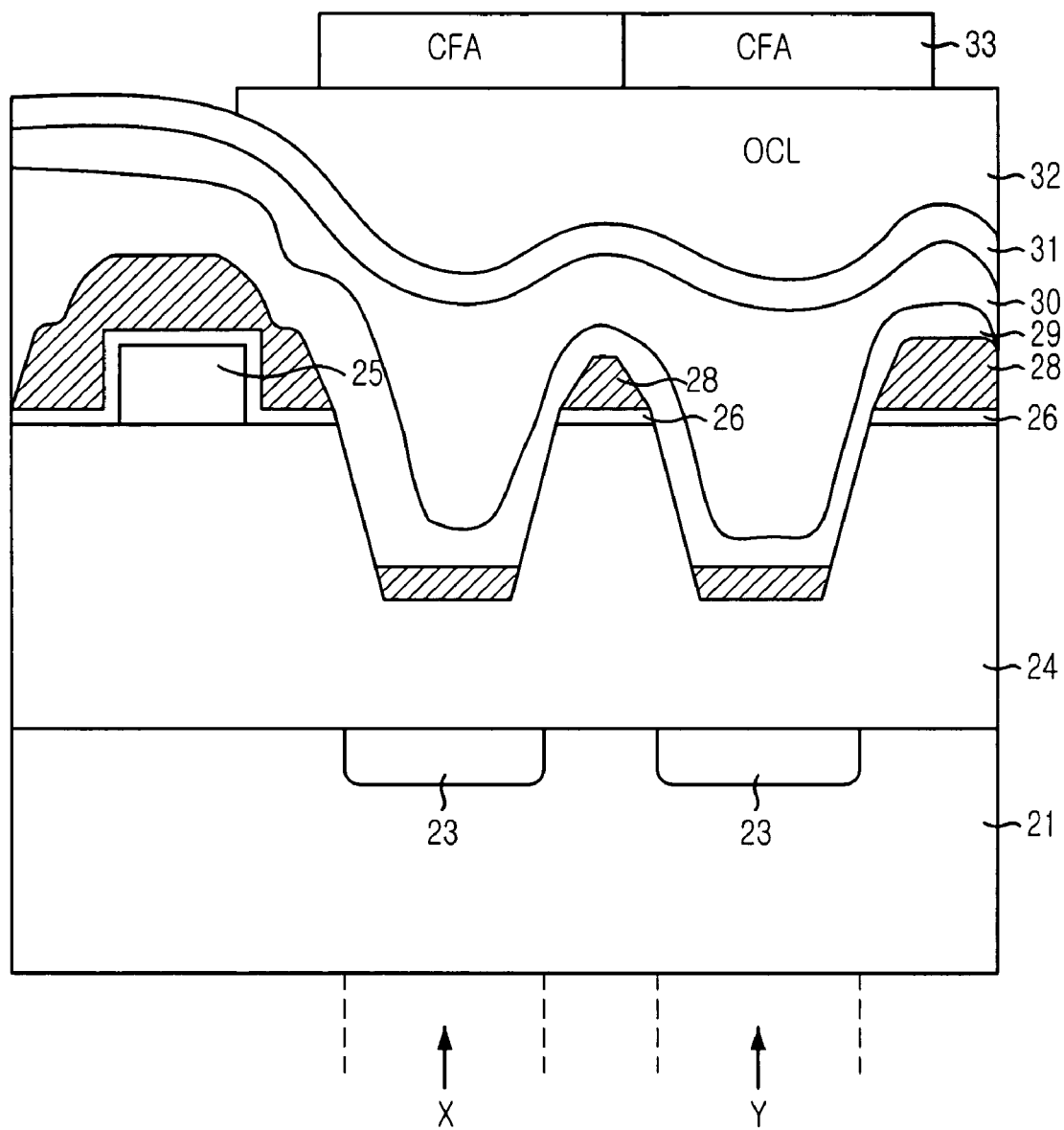

Referring to FIG. 2F, a plurality of color filter arrays (CFAs) 33 are formed on the planarization layer 32. If an intended level of planarization is not obtained through employing a single layer of the planarization layer 32, another layer of the planarization layer is formed on the above planarization layer 32, being overlaid with the CFAs 33.

Figure 2G:
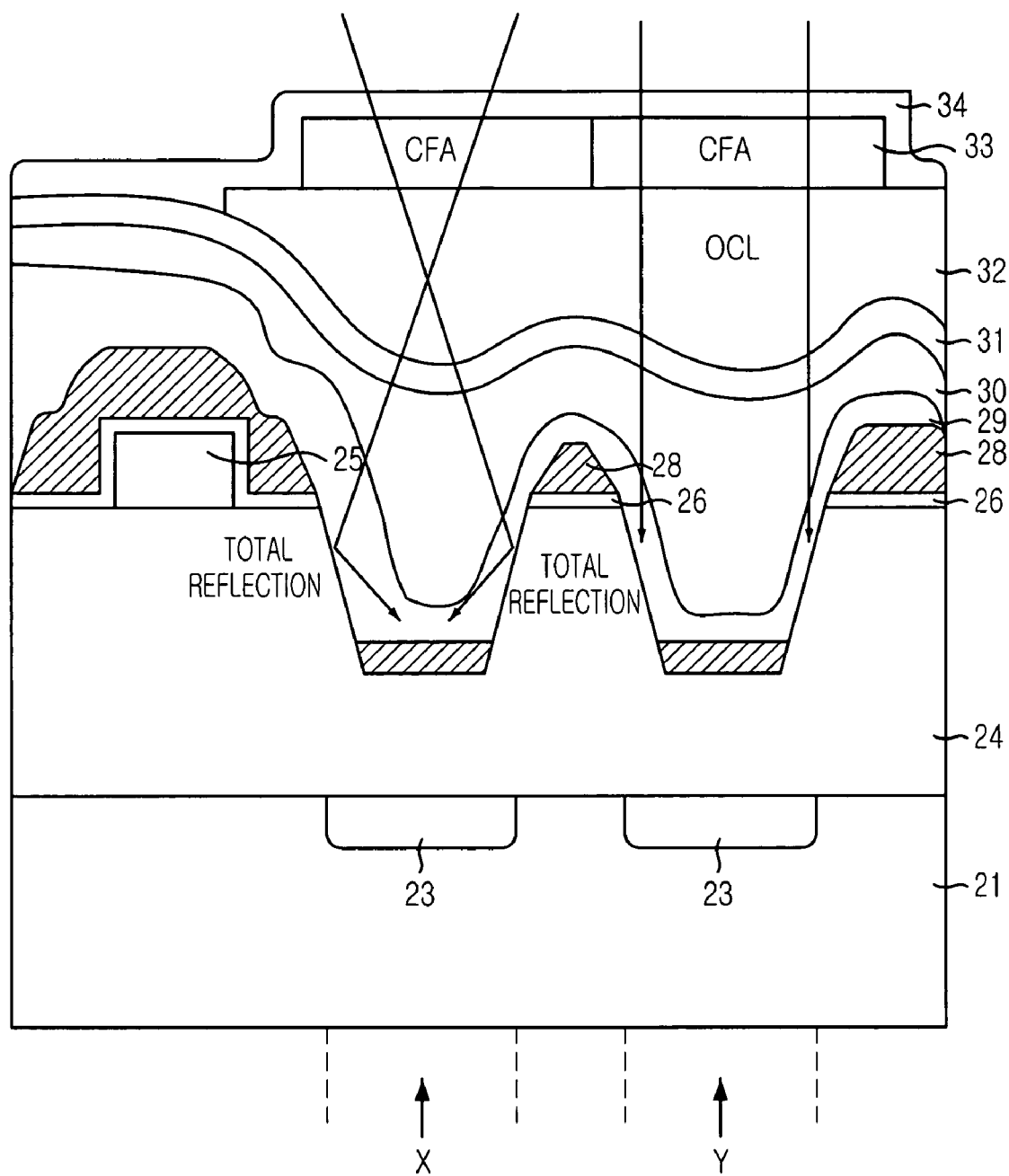

Referring to FIG. 2G, a passivation layer 34 is formed on the CFAs 33 for the purpose of protecting the device elements against moisture and dust. Herein, the passivation layer 34 is formed by using a material such as low temperature oxide (LTO), coral or the like.

Also, FIG. 2G shows paths of incident lights in the CMOS image sensor. As shown, the lights incident to the photodiode 23 disposed in the central region X of the pixel array are transmitted in parallel, thereby resulting in high light collection efficiency. On the contrary, as described above, those lights incident to the photodiode 23 disposed in the edge region X of the pixel array have large incident angles and are not transmitted in parallel. Thus, the conventionally used microlenses are not sufficient to focus lights with large incident angles and as a result, photosensitivity decreases.

However, the use of the prism that induces the total reflection makes it possible to collect lights even having large incident angles with high efficiency. As a result, it is further possible to obtain consistent photosensitivity in the central and edge regions Y and X of the pixel array of the CMOS image sensor.

Also, since the microlenses are not used in this preferred embodiment, the resulting device structure has a planarized upper profile. Hence, there is less chance of contamination by particles.

Furthermore, there is another effect on reduction in manufacturing costs since the above described device structure can be formed in a low resolution condition because a reticle having an I-line type and a high-grid size is used for the etching process for forming the trenches for forming the prism.

In addition, according to the preferred embodiment of the present invention, it is not necessary to carry out an optical simulation and as a result, it is possible to decrease a time taken for designing the devices.

The present application contains subject matter related to the Korean patent application No. KR 2004-0032009, filed in the Korean Patent Office on May 6, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a complementary metal oxide semiconductor (CMOS) image sensor with a pixel array including a plurality of unit pixels, the method comprising the steps of:
   forming a plurality of photodiodes corresponding to the respective unit pixels on a substrate;
   sequentially forming an inter-layer insulation layer and an uppermost metal line on the substrate and the photodiodes;
   etching the inter-layer insulation layer in a predetermined depth to form a plurality of trenches corresponding to the respective photodiodes;
   depositing a high density plasma (HDP) oxide layer such that the HDP oxide layer disposed between the trenches has a tapered profile;
   depositing a nitride layer having a higher refractive index than that of the inter-layer insulation layer to fill the trenches with a predetermined thickness; and
   depositing an insulation layer having a lower refractive index than that of the nitride layer to fill the trenches, thereby forming a prism, wherein the prism induces a total reflection of lights incident to the photodiodes disposed in edge regions of the pixel array.

2. The method of claim 1, further including the steps of:
   forming a TEOS oxide layer on the insulation layer;
   forming a planarization layer on the insulation layer; and
   forming a plurality of color filter arrays on the planarization layer.

3. The method of claim 1, wherein the nitride layer is a silicon nitride layer and has a refractive index of approximately 2.0.

4. The method of claim 1, wherein the insulation layer is one layer selected from a group consisting of a field oxide layer, a hydrogen silsesquioxane (HSQ) layer and a spin-on-glass (SOG) layer.

5. The method of claim 4, wherein at the step of depositing the insulation layer, a flow process is carried out at a temperature ranging from approximately 350° C. to approximately 450° C. after the step of depositing the insulation layer.

6. The method of claim 1, wherein the step of forming the plurality of trenches is carried out such that a distance from a top surface of the photodiode to a bottom surface of the trench ranges from approximately 1,000 Å to approximately 10,000 Å.

7. The method of claim 1, wherein the step of forming the plurality of trenches is carried out such that a diameter of an upper part of the trench ranges from approximately 2.0 μm to approximately 2.8 μm.

8. The method of claim 7, wherein the nitride layer has a thickness ranging from approximately 0.2 μm to approximately 1.5 μm.

9. The method of claim 1, wherein at the step of forming the plurality of trenches, if an upper diameter of the trench is approximately 2.0 μm, a bottom diameter of the trench ranges from approximately 1.0 μm to approximately 1.6 μm.

10. The method of claim 1, wherein the step of depositing the HDP oxide layer is carried out until the HDP oxide layer has a thickness ranging from approximately 1,000 Å to approximately 10,000 Å.

11. The method of claim 1, wherein the step of forming the uppermost metal line on the inter-layer insulation layer further includes the step of forming a TEOS oxide layer on the uppermost metal line.

12. The method of claim 2, wherein the step of forming the plurality of color filter arrays further includes the step of forming a passivation layer on the plurality of color filter arrays.

13. The method of claim 12, wherein the passivation layer is a low temperature oxide layer.

14. The method of claim 2, wherein at the step of forming the plurality of color filter arrays, another planarization layer is formed on the planarization layer and then, the plurality of color filter arrays are formed on said another planarization layer.

15. A method for fabricating a complementary metal oxide semiconductor (CMOS) image sensor with a pixel array including a plurality of unit pixels, the method comprising the steps of:
   forming a plurality of photodiodes corresponding to the respective unit pixels;
   sequentially forming an inter-layer insulation layer and an uppermost metal line on the substrate and the plurality of photodiodes;
   etching the inter-layer insulation layer in a predetermined depth to form a plurality of trenches corresponding to the respective photodiodes;
   depositing a high density oxide (HDP) oxide layer such that a portion of the HDP oxide layer disposed between the trenches has a tapered profile;
   filling a nitride layer having a higher refractive index than that of the inter-layer insulation layer into the trenches, thereby forming a prism;
   forming a planarization layer on the insulation layer; and
   forming a plurality of color filter arrays on the planarization layer, wherein the prism includes a total reflection of lights incident to the photodiodes disposed in edge regions of the pixel array.

16. A complementary metal oxide semiconductor (CMOS) image sensor with a pixel array including a plurality of unit pixels, the CMOS image sensor comprising:
   a plurality of photodiodes being formed on a substrate and corresponding to the respective unit pixels;
   an inter-layer insulation layer formed on the substrate and the photodiodes;
   an uppermost metal line formed on the inter-layer insulation layer;
   a plurality of trenches being formed by etching the inter-layer insulation layer in a predetermined depth and corresponding to the respective photodiodes;
   a high density plasma (HDP) oxide layer of which portion disposed between the trenches has a tapered profile;
   a nitride layer filled into the trenches with a predetermined thickness and having a higher refractive index than that of the inter-layer insulation layer;
   a prism inducing a total reflection of lights incident to the photodiodes disposed in edge regions of the pixel array and having a stack structure obtained by depositing an insulation layer on the nitride layer, the insulation layer having a lower refractive index than that of the nitride layer;
   a planarization layer formed on the insulation layer; and
   a plurality of color filter arrays formed on the planarization layer.

17. A complementary metal oxide semiconductor (CMOS) image sensor with a pixel array including a plurality of unit pixels, the CMOS image sensor comprising:

a plurality of photodiodes being formed on a substrate and corresponding to the respective unit pixels;

an inter-layer insulation layer formed on the substrate and the photodiodes;

an uppermost metal line formed on the inter-layer insulation layer;

a plurality of trenches being formed by etching the inter-layer insulation layer in a predetermined depth and corresponding to the respective photodiodes;

a high density plasma (HDP) oxide layer of which portion disposed between the trenches has a tapered profile;

a prism being formed by filling the trenches with a nitride layer having a higher refractive index than that of the inter-layer insulation layer and inducing a total reflection of lights incident to the photodiodes disposed in edge regions of the pixel array;

a planarization layer formed on the insulation layer; and a plurality of color filter arrays formed on the planarization layer.

18. The CMOS image sensor of claim 16, wherein the nitride layer is a silicon nitride (SiN) layer and has a refractive index of approximately 2.0.

19. The CMOS image sensor of claim 17, wherein the nitride layer is a SiN layer and has a refractive index of approximately 2.0.

20. The CMOS image sensor of claim 16, wherein the insulation layer is one layer selected from a group consisting of a field oxide layer, a hydrogen silsesquioxane (HSQ) layer and a spin-on-glass (SOG) layer.

21. The CMOS image sensor of claim 16, further including:

a tetraethylorthosilicate (TEOS) oxide layer formed beneath the planarization layer; and a passivation layer formed on the plurality of color filter arrays.

22. The method of claim 17, further including:

a tetraethylorthosilicate (TEOS) oxide layer formed beneath the planarization layer; and a passivation layer formed on the plurality of color filter arrays.

* * * * *